United States Patent [19]

Takiar et al.

[11] Patent Number: 4,595,480
[45] Date of Patent: Jun. 17, 1986

[54] SYSTEM FOR ELECTROPLATING MOLDED SEMICONDUCTOR DEVICES

[75] Inventors: Hem P. Takiar, San Jose; Jagdish Belani, Cupertino, both of Calif.

[73] Assignee: National Semiconductor Corporation, Santa Clara, Calif.

[21] Appl. No.: 780,157

[22] Filed: Sep. 26, 1985

[51] Int. Cl.$^4$ .............................................. C25D 17/08
[52] U.S. Cl. .............................................. 204/297 W
[58] Field of Search .............................. 204/15, 297 W

[56] References Cited

U.S. PATENT DOCUMENTS 2,073,679  3/1937  Brown ........................... 204/297 W
3,043,767  7/1962  Tobey ........................... 204/297 W Primary Examiner—T. M. Tufariello
Attorney, Agent, or Firm—Michael J. Pollock; Paul J. Winters; Gail W. Woodward

[57] ABSTRACT

A system for electroplating metals, such as tin and solder on semiconductor lead frame strips includes a magazine for carrying the lead frames and a separate plating rack for carrying the magazines. The plating rack, which has an insulated surface, includes means for directing a current to the lead frame strips when the magazine is inserted in the plating rack. An electric coupling means is also provided for assuring that the current from the plating rack is evenly distributed among the individual lead frame strips so that uniform plating results. The magazine is suitable for transporting and storing the lead frame strips during assembly of semiconductor components, and it is unnecessary to remove the lead frame strips from the magazine for mounting on the plating rack.

10 Claims, 4 Drawing Figures

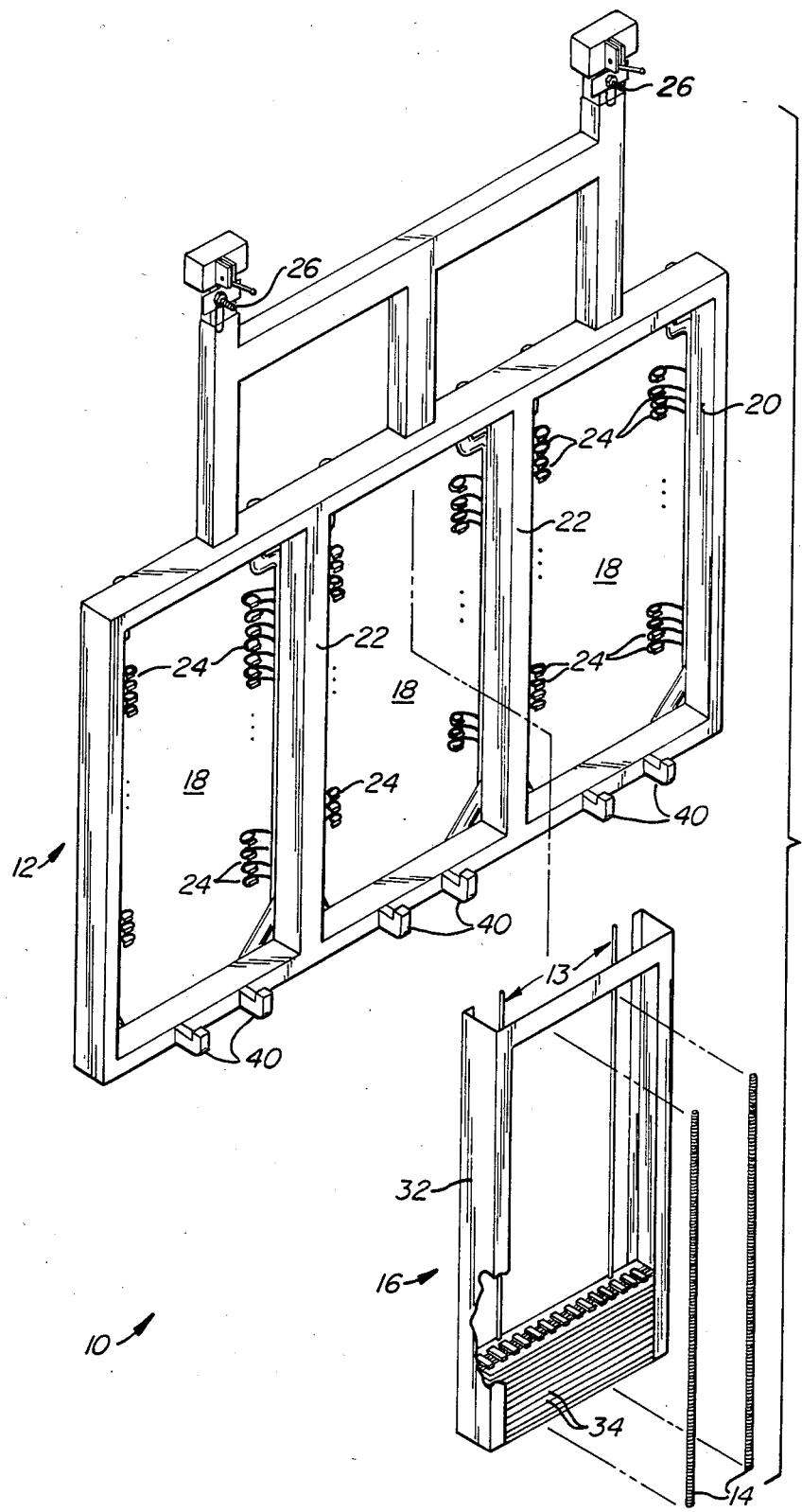
FIG._1.

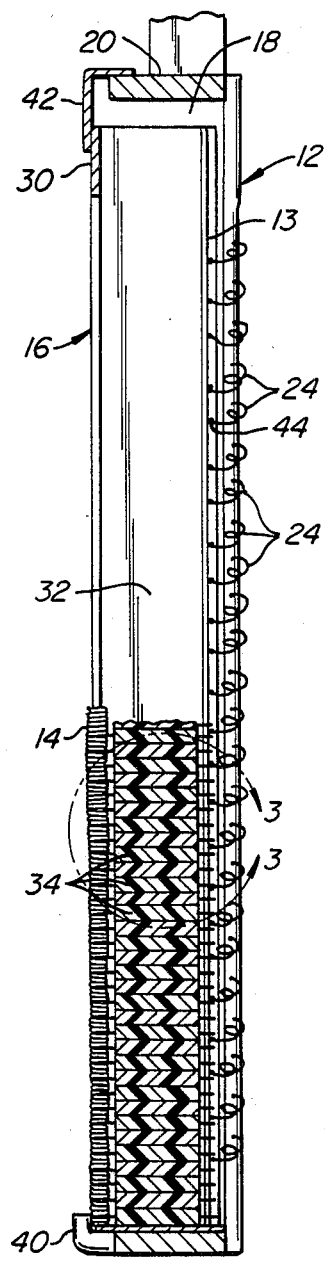
FIG._2.
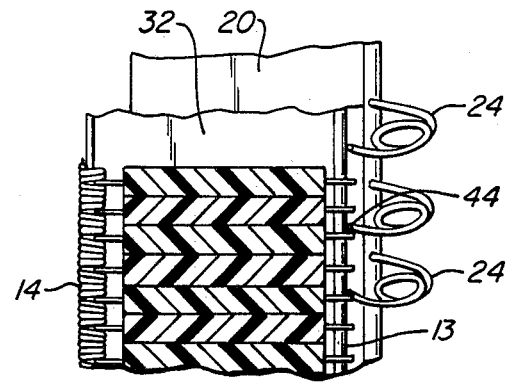
FIG._3.
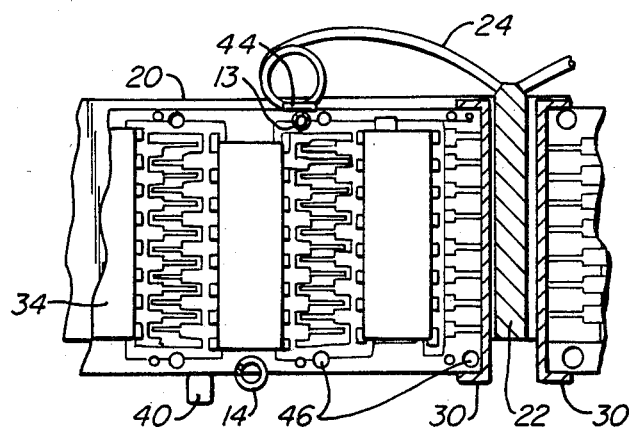
FIG._4.

SYSTEM FOR ELECTROPLATING MOLDED SEMICONDUCTOR DEVICES

BACKGROUND OF THE INVENTION

It is often desirable to solder coat leads on molded semiconductor devices, such as dual in-line packages, in order to facilitate soldering of the leads to printed circuit boards and the like. Such solder coating normally takes place after encapsulation of the device, but before the device has been separated or singulated from the lead frame strip, and has been accomplished by hanging a plurality of individual lead frame strips on hooks on a common plating rack. The plating rack is then immersed in a plating bath. By applying a plating current through the rack, all of the lead frame strips hanging from the rack would be solder coated simultaneously.

Although the above-described method provides adequate solder plating on the individual devices, the method is time consuming and requires a substantial labor input to individually hang and remove the lead frame strips, which is very costly on a per unit basis. Moreover, the plating racks frequently are unable to evenly distribute the plating current, resulting in uneven plating thicknesses among the individual lead frames.

It would therefore be desirable to develop new methods and systems for solder plating lead frame strips for molded devices which would be less time consuming and would require less labor input. In particular, it would be desirable to provide a system for plating a plurality of individual lead frames, which system would not require that the lead frames be manually removed from the lead frame carrier prior to plating, and which would assure even plating among the various lead frames being plated.

SUMMARY OF THE INVENTION

The present invention provides a plating system including a magazine for holding a plurality of individual lead frame strips with molded packages and a plating rack for carrying one or more magazines and directing a plating current to the individual lead frame strips in the magazine. The current directed through the plating rack is evenly distributed to each of the individual lead frame strips in order to assure that each of the lead frames is uniformly coated with solder. The system of the present invention is particularly efficient since the magazines may also be used for transporting and storing the individual lead frame strips, and there is no requirement that the strips be manually removed from the magazine and individually placed on the plating rack.

In the exemplary embodiment, the electroplating system comprises a magazine which may be removably inserted into a separate plating rack. The magazine is capable of receiving and supporting a plurality of individual lead frame strips which may be stacked therein. The plating rack includes a multiplicity of resilient electrical contacts which are electrically connected to a common terminal. By mounting the magazine on the plating rack, a circuit is established from the terminal through the resilient contacts to the individual lead frame strips in the magazine. An electric coupling means which engages both the lead frame strips and the resilient electric contacts is provided for evenly distributing the current from the terminal among the plurality of lead frames. Conveniently, the electrical coupling means may be either an elongate rod which is inserted through registration holes on the lead frame strips or an elongate spring which is interleaved with the edges of the stacked lead frame strips.

BRIEF DESCRIPTION OF THE DRAWINGS

FIG. 1 is an isometric view illustrating the magazine, electrical coupling means, and the plating rack of the plating system of the present invention.

FIG. 2 is a side elevational view of the assembled plating system shown in cross-section.

FIG. 3 is a detailed view shown at line 3—3 in FIG. 2.

FIG. 4 is a partial, top sectional view of the assembled plating system illustrating the electrical contact between resilient electrical contact members and the lead frames.

DESCRIPTION OF THE PREFERRED EMBODIMENT

According to the present invention, a system for electroplating metals, such as solder and tin, onto semiconductor lead frame strips utilizes a magazine for supporting a stack of lead frame strips to be plated. In addition to its use within the plating system, the magazine is suitable for storing and transporting the lead frame strips between various other assembly operations. The electroplating system also includes a plating rack defining a plurality of receptacles, usually three receptacles, for removably securing individual magazines. The rack includes a multiplicity of resilient electrical contacts, typically coiled hooks, distributed along each receptacle in a position so that the contacts engage the individual lead frames when the magazine is in place on the rack. An electrically conductive member, typically a rod or spring, is disposed to engage the stack of lead frame strips and optionally the resilient contacts to assure that the current is evenly distributed among the individual lead frame strips to provide for uniform plating.

The plating process occurs during the semiconductor assembly operation at a point after the integrated circuit package has been molded, but before the individual package has been separated or singulated from the lead frame strip.

Referring now to FIG. 1, the preferred embodiment of electroplating system 10 of the present invention comprises a plating rack 12, a pair of elongate rods 13, electrically conductive springs 14, and a magazine assembly 16. The plating rack 12 includes three receptacles 18 defined by a rectangular frame member 20 and two vertical dividing bars 22. As used hereinafter, all references to vertical, horizontal, upward, downward, and the like will be made in reference to the normal upright position of the plating rack 12 as illustrated in FIG. 1. It will be appreciated, of course, that the orientation of the unit may be varied without changing the relative positions of the various elements.

Each receptacle 18 on the plating rack includes a plurality of coiled hooks 24 which are connected at one end to the vertical members of frame 20 or the vertical dividing members 22, and which are unconnected at the other end. The coiled hooks 24 define resilient electrical contact members which are intended to supply current to the individual lead frame strips which are stacked in magazine 16, as described in detail hereinafter.

The coiled hooks 24 are in electrical contact with terminal members 26 also mounted on the frame 20. In the preferred embodiment, the electrical contact between the coiled springs 24 and the terminals 26 is provided by the frame 20 itself, which is composed of an electrically conductive metal. The frame 20 is coated with an insulating material such as a high temperature fluorocarbon, so that the only exposed conductors are the hooks 24 and the terminals 26. In this way, the frame 20 does not itself become plated during the plating process. It will be appreciated, of course, that the frame 20 could be composed of a non-conductive material, such as a plastic material, and the electrical coupling provided by a separate wire or conductor embedded in or mounted on the frame 20. The use of an electrically conductive frame 20, however, is preferred since it allows for even distribution of the relatively high plating currents to each of the coiled wires 24.

The rods 13 and coil springs 14 are provided to assure even distribution of the current from the coiled wires 24 to the lead frame strips and magazine 16, as will be described in more detail hereinafter.

The magazine 16 comprises a pair of vertical channel members 30 and 32 which are joined together at the top and bottom. The dimensions of the magazine correspond to the peripheral dimensions of lead frame strips 34 which are to be stacked in the magazine, and the magazine is suitable for transporting and storing a stack of the lead frame strips.

Referring now to FIGS. 2-4 as well as FIG. 1, lead frame strips 34 are stacked in the magazine 30, and the magazine inserted into receptacle 18 of the plating rack 12. Rods 13 are inserted down through vertically aligned registration holes 46 in the lead frame strips 34 so that the coiled hooks 24 penetrate the lead frame strip stack and contact the rods. In this way, the rods 14 and plurality of hooks 24 assure the even distribution of current to each of the individual lead frame strips 34. Optionally, coil springs 14 are placed and the edges of the lead frame strips 34, as best illustrated in FIG. 3. The edges of the lead frames 34 penetrate the loops of the coil spring 14 so that the coil spring is firmly held in place on the stack of lead frames. The coiled conductors 24, help assure that current is evenly distributed on the opposite side of the lead frame strips 34.

Each magazine 30 is held in place by a pair of hooks 40 at the bottom of each receptacle 18, and hooks 42 at the top of the receptacle 18. Thus, the magazine may be easily inserted into the plating rack 12 and removed therefrom. The coiled hooks 24 are extended slightly outward from the plating rack 12 when the magazine 16 is in place so that the conductors remain firmly pressed against the rods 13 to assure good electrical contact.

The coiled hooks 24 are insulated, except at their remote end 44 where the conductive material is exposed for contacting the rods 13. The remainder of the plating rack 12 is also insulated on the surface, except for the terminals 26, as is the entire surface of the magazine 16. Such insulation is provided to prevent plating on the rack 12 and magazine 16 during the plating operation. The rods 13 and coil springs 14, of course, are not insulated since they must make electrical contact at numerous points along their lengths.

In operation, lead frame strips 34 are stacked in magazine 30, as illustrated in FIGS. 1 and 2. Typically, the lead frame strips 34 will be automatically stacked as a result of an earlier packaging operation, such as encapsulation. The rods 13 are then inserted in registration holes 46, and the magazine is inserted into receptacle 18 on the plating rack 12. Optionally, the elongate springs 14 may be mounted on the lead frame stack on the side opposite the coiled conductors 24. The plating rack 12 is then immersed into a conventional tin or solder plating bath, such as a conventional tin-lead solder plating bath. A current is applied to the plating rack 12, which acts as a cathode with a lead or other suitable anode also immersed in the plating bath. After a sufficient time to provide for a desired thickness of solder plate on the lead frames, the current is stopped and the plating rack removed from the bath. After washing, the magazines may be removed from the plating rack 12 and transported to the next packaging operation, such as the stamping operation where the individual packages are removed from the lead frame strips.

Although the foregoing invention has been described in some detail by way of illustration and example for purposes of clarity of understanding, it will be obvious that certain changes and modifications may be practiced within the scope of the appended claims.

What is claimed is:

1. A system for electroplating semiconductor lead frame strips, said system comprising:
a magazine capable of receiving and supporting a plurality of individual lead frame strips;
a plating rack capable of removably securing at least one magazine, said plating rack including a multiplicity of resilient contacts and a terminal, said contacts and said terminal being electrically connected; and
electric coupling means for engaging both the lead frame strips and the electric contact members and for evenly distributing current from the terminal among the plurality of lead frames.

2. A system as in claim 1, wherein the magazine is insulated so that it will not become plated.

3. A system as in claim 1, wherein the plating rack is composed of a conductive metal which is protected by an insulating layer at all points except at the terminal and the resilient contacts.

4. A system for electroplating semiconductor lead frame strips, said system comprising:
a magazine including a pair of opposed channel members for receiving and supporting opposite ends of a plurality of stacked lead frame strips;
a plating rack including at least one receptacle for removably securing one magazine, said plating rack further including a multiplicity of resilient contacts distributed along the receptacle and a terminal electrically connected to the contacts; and
one or more electrically conductive members which can be interposed between the resilient contacts and the lead frames when the magazine is mounted within the plating rack, whereby electric current from the terminal is evenly distributed among the plurality of lead frames whereby substantially uniform plating of each lead frame is achieved.

5. A system as in claim 4, wherein the magazine is insulated so that it will not become plated.

6. A system as in claim 4, wherein the plating rack is composed of a conductive metal which is protected by an insulating layer at all points except at the terminal and the resilient contacts.

7. A system as in claim 4, wherein the receptacle includes a pair of hooks at the top and a pair of hooks at the bottom for removably securing the magazine.

8. A system as in claim 4, wherein the resilient contacts are coiled wires uninsulated at one end and connected to the rack at the other end.

9. A system as in claim 4, wherein the electrically conductive member is a spring.

10. A system as in claim 4, wherein the electrically conductive member is a rod.

* * * * *